(12) United States Patent
Won

(10) Patent No.: US 8,916,899 B2
(45) Date of Patent: Dec. 23, 2014

(54) LIGHT EMITTING APPARATUS AND LIGHTING SYSTEM

(75) Inventor: Jung Min Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 79 days.

(21) Appl. No.: 13/020,419

(22) Filed: Feb. 3, 2011

(65) Prior Publication Data

US 2011/0193127 A1   Aug. 11, 2011

(30) Foreign Application Priority Data

Feb. 8, 2010   (KR) .................. 10-2010-0011468

(51) Int. Cl.
*H01L 33/62* (2010.01)
*H01L 33/64* (2010.01)
*H01L 33/48* (2010.01)

(52) U.S. Cl.
CPC .............. *H01L 33/62* (2013.01); *H01L 33/647* (2013.01); *H01L 33/486* (2013.01); *H01L 2224/48091* (2013.01); *H01L 2224/48227* (2013.01); *H01L 2924/01322* (2013.01); *H01L 33/642* (2013.01)
USPC .............................................. 257/99; 438/30

(58) Field of Classification Search
USPC ........... 257/99, 57, 59, 72, 83, 257, 290, 351, 257/368, 392; 438/30, 48, 128, 149, 151, 438/157, 161, 28
See application file for complete search history.

(56) References Cited

U.S. PATENT DOCUMENTS

| | | | |
|---|---|---|---|
| 7,795,053 B2 * | 9/2010 | Ohno et al. | .................... 438/26 |
| 7,884,376 B2 | 2/2011 | Lu et al. | |
| 7,999,281 B2 | 8/2011 | Shimokawa et al. | |
| 8,203,218 B2 | 6/2012 | Kim | |
| 2001/0042865 A1 | 11/2001 | Oshio et al. | |
| 2005/0184297 A1 | 8/2005 | Hsieh | |
| 2007/0181895 A1 | 8/2007 | Nagai | |
| 2008/0035948 A1 | 2/2008 | Shin et al. | |
| 2009/0095974 A1 * | 4/2009 | Taguchi et al. | ................. 257/99 |
| 2009/0122554 A1 | 5/2009 | Ohashi et al. | |
| 2009/0261374 A1 * | 10/2009 | Hayashi | .......................... 257/99 |
| 2009/0315056 A1 * | 12/2009 | Kim | ............................. 257/98 |
| 2010/0123148 A1 * | 5/2010 | Park | ............................... 257/94 |
| 2011/0114706 A1 | 5/2011 | Sasaoka et al. | |

FOREIGN PATENT DOCUMENTS

| | | |
|---|---|---|
| JP | 2006-080141 | 3/2006 |
| JP | 2006-147865 A | 6/2006 |
| JP | 2006-287267 A | 10/2006 |
| JP | 2007-95855 A | 4/2007 |
| JP | 2007-095855 * | 8/2007 |
| JP | 2007-529879 A | 10/2007 |
| JP | 2008-103467 | 5/2008 |
| JP | 2009-54893 A | 3/2009 |

(Continued)

OTHER PUBLICATIONS

WO2005091383.*

*Primary Examiner* — Tony Tran
(74) *Attorney, Agent, or Firm* — McKenna Long & Aldridge LLP

(57) ABSTRACT

Disclosed are a light emitting apparatus and a lighting system. The light emitting apparatus includes a body, a first electrode having a protrusion pattern on the body, a second electrode electrically separated from the first electrode on the body, an adhesive layer on the first electrode including the protrusion pattern, and a light emitting device on the adhesive layer.

17 Claims, 7 Drawing Sheets

(56) References Cited

FOREIGN PATENT DOCUMENTS

| | | |
|---|---|---|
| JP | 2009-94409 A | 4/2009 |
| KR | 2003-0063832 A | 7/2003 |
| TW | 200832756 A | 8/2008 |
| TW | 200910640 A | 3/2009 |
| WO | WO 2005/091383 A1 | 9/2005 |
| WO | WO 2006/016398 A1 | 2/2006 |
| WO | WO 2009/157664 | 12/2006 |
| WO | 2009/157160 A1 | 12/2009 |

\* cited by examiner

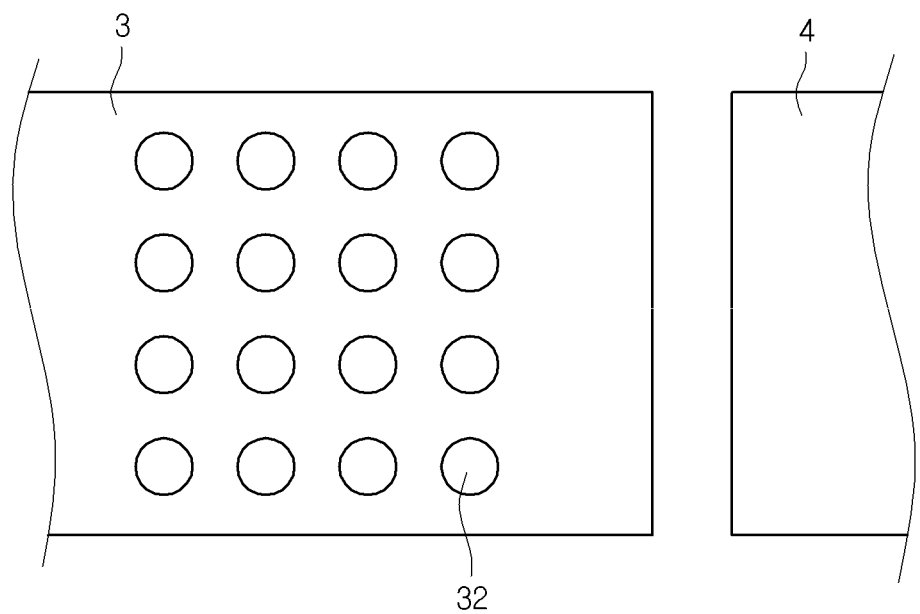

LIGHT EMITTING APPARATUS AND LIGHTING SYSTEM

The present application claims priority of Korean Patent Application No. 10-2010-0011468 filed on Feb. 8, 2010, which is hereby incorporated by reference in its entirety.

BACKGROUND

The embodiment relates to a light emitting apparatus and a lighting system.

Recently, a light emitting diode has been mainly used as a light emitting device.

The light emitting diode includes an N type semiconductor layer, an active layer, and a P type semiconductor layer. As power is applied to the N and P type semiconductor layers, light is generated from the active layer.

The light emitting device is electrically connected to an electrode, so that power is applied to the light emitting device through a circuit body. The light emitting device may be electrically connected to the electrode through a wire, or may be mounted on the electrode so that the light emitting device may be directly electrically connected to the electrode.

SUMMARY

The embodiment provides a light emitting apparatus having a novel structure and a lighting system.

The embodiment provides a light emitting apparatus capable of reducing thermal resistance and a lighting system.

According to the embodiment, a light emitting apparatus includes a body, a first electrode having a protrusion pattern on the body, a second electrode electrically separated from the first electrode on the body, an adhesive layer on the first electrode including the protrusion pattern, and a light emitting device on the adhesive layer.

According to the embodiment, a light emitting apparatus includes a body, a first electrode and a second electrode which are separated from each other on the body, a protrusion pattern on the first electrode, and a light emitting device on the first electrode and the protrusion pattern.

BRIEF DESCRIPTION OF THE DRAWINGS

FIGS. 10 and 11 are sectional views showing a protrusion pattern and a hole in a light emitting apparatus according to another embodiment.

DETAILED DESCRIPTION OF THE EMBODIMENTS

Figure 1:
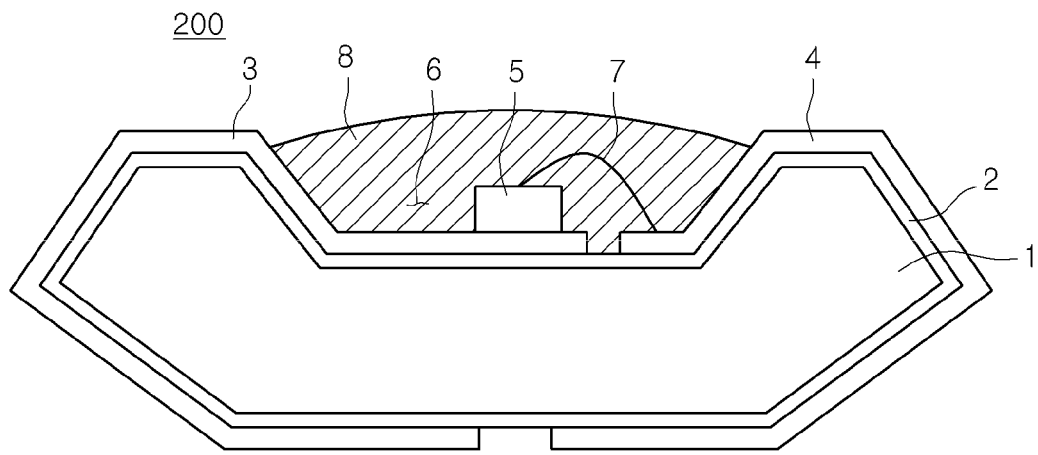
FIG. 1 is a sectional view showing a light emitting apparatus according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting apparatus and a lighting system according to embodiments will be described in detail with reference to accompanying drawings.

FIG. 1 is a sectional view showing a light emitting apparatus 200 according to an embodiment.

Referring to FIG. 1, the light emitting apparatus 200 includes a body 1, an insulating layer 2 formed on the surface of the body 1, first and second electrodes 3 and 4 formed on the surface of the insulting layer 2, and a light emitting device 5 electrically connected to the first and second electrodes 3 and 4 installed at an upper portion of the body 1.

In addition, a substrate 300 (see FIGS. 6 and 7) electrically connected to the first and second electrodes 3 and 4 may be additionally provided at a lower portion of the body 1.

The body 1 may include an electrical conductive material or an electrical insulating material. For example, the body 1 may include metal or ceramic material. According to the embodiment, the body 1 includes silicon material as an example.

The body 1 is provided therein with a cavity 6. A bottom surface and a lateral surface of the cavity 6 are formed on a top surface of the body 1. The lateral surface of the cavity 6 may be inclined.

The insulating layer 2 may include insulating material, such as at least one of $SiO_2$, $SiN_x$, and $Al_2O_3$. The insulating layer 2 may be formed on the top surface, the lateral surface, and the bottom surface of the body 1 to prevent a current from leaking through the body 1. For example, the insulating layer 2 may include an oxide film obtained by oxidizing the body 1.

Figure 8:
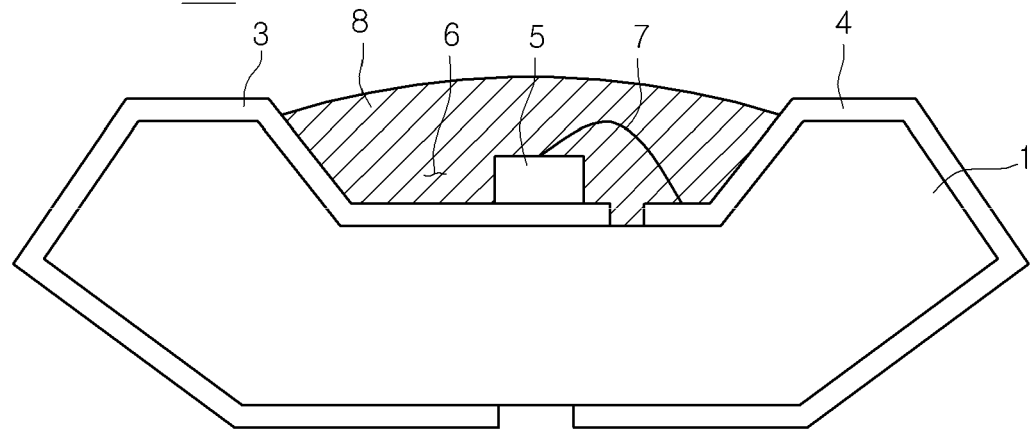
FIG. 8 is a sectional view showing a light emitting apparatus according to another embodiment.

According to the embodiment, as shown in FIG. 8, the insulating layer 2 may not be formed so that the first and second electrodes 3 and 4 may be directly formed on the body 1.

The first and second electrodes 3 and 4 are electrically separated from each other, and electrically connected to the light emitting device 5. The first and second electrodes 3 and 4 are formed on the body 1, and may extend to the lateral surface and the bottom surface of the body 1. In addition, the first and second electrodes 3 and 4 may extend to the bottom surface of the body 1 through the body 1.

The light emitting device 5 may be installed in the cavity 6 of the body 1.

For example, the light emitting device 5 may be mounted on the insulating layer 2 and electrically connected to the first and second electrodes 3 and 4 through a wire 7.

In addition, the light emitting device 5 may be directly mounted on the first electrode 3 or the second electrode 4 so that the light emitting device 5 may be electrically connected to the first electrode 3 and the second electrode 4 through the wire 7.

In addition, the light emitting device 5 may be mounted on one electrode of the first and second electrodes 3 and 4 so that the light emitting device 5 may be directly connected to the electrode, and electrically connected to the other through the wire 7.

According to the embodiment, the first and second electrodes 3 and 4 supply power to the light emitting device 5, and increase light efficiency by reflecting light emitted from the light emitting device 5.

According to the embodiment, the first electrode 3 may serve as a heat sink to easily dissipate heat emitted from the light emitting device 5 to the outside.

An encapsulant 8 may be formed in the cavity 6 to protect the light emitting device 5 and the wire 7. A top surface of the encapsulant 8 may have various shapes such as a concave shape, a convex shape, and a flat shape, and the orientation angle of light emitted from the light emitting device 5 may vary according to the shape of the encapsulant 8.

In addition, the encapsulant 8 may include luminescence material. The luminescence material may change color of light emitted from the light emitting device 5.

Meanwhile, the light emitting device 5 may be coupled with the first electrode 3 through a paste bonding scheme or a eutectic bonding scheme. Since heat transfer efficiency of a paste is low in the paste bonding scheme, the paste bonding scheme represents heat dissipation efficiency lower than that of the eutectic bonding scheme.

Therefore, in the light emitting apparatus 200 according to the embodiment, the light emitting device 5 is bonded to the first electrode 3 through the eutectic bonding scheme, and the contact area of a eutectic bonding layer and the first electrode 3 is increased such that heat transfer efficiency can be improved.

Figure 2:
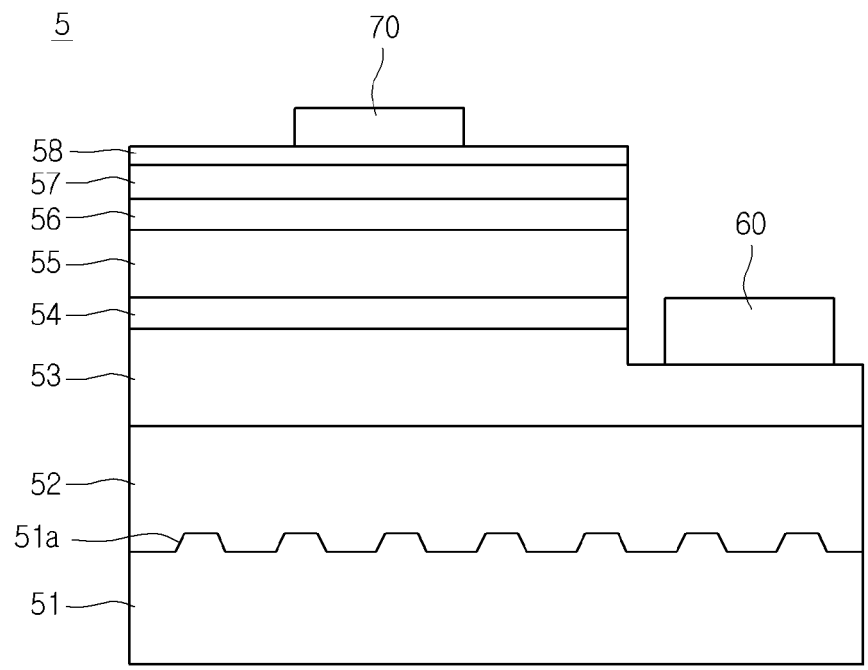
FIG. 2 is a sectional view showing a light emitting device in the light emitting apparatus according to the embodiment.

FIG. 2 is a sectional view showing the light emitting device 5 in the light emitting apparatus 200 according to the embodiment.

The light emitting device 5 according to the embodiment includes an undoped semiconductor layer 52 on a growth substrate 51, a light emitting structure layer including a first conductive semiconductor layer 53, an active layer 55, and a second conductive semiconductor layer 57 on the undoped semiconductor layer 52. A first electrode layer 60 is formed on the first conductive semiconductor layer 53, and a second electrode layer 70 is formed above the second conductive semiconductor layer 57.

A first conductive InGaN/GaN superlattice structure or InGaN/InGaN superlattice structure 54 may be formed between the first conductive semiconductor layer 53 and the active layer 55.

A second conductive AlGaN layer 56 may be formed between the second conductive semiconductor layer 57 and the active layer 55.

For example, the growth substrate 51 may include at least one selected from the group consisting of sapphire ($Al_2O_3$), SiC, GaAs, GaN, ZnO, Si, GaP, InP, and Ge, but the embodiment is not limited thereto. The light emitting structure layer may be grown from the growth substrate 51. For example, the growth substrate 51 may include the sapphire substrate.

A plurality of protrusion patterns 51*a* may be formed on the growth substrate 51, and may scatter light emitted from the active layer 55 to increase light efficiency. For example, the protrusion patterns 51*a* may have one of a semispherical shape, a polygonal shape, a pyramid shape, and a nanocolumn shape.

Although the undoped semiconductor layer 52 is not intentionally doped with first conductive impurities, the undoped semiconductor layer 52 may include a nitride layer having the conductive characteristic of the first conductive type. For example, the undoped nitride layer 52 may include an undoped-GaN layer. A buffer layer (not shown) may be formed between the undoped semiconductor layer 52 and the growth substrate 51. In addition, the undoped semiconductor layer 52 does not have to be formed essentially.

The first conductive semiconductor layer 53 may include an N type semiconductor layer. The first conductive semiconductor layer 53 may include a semiconductor material having a compositional formula of $In_xAl_yGa_{1-x-y}N$ ($0 \le x \le 1$, $0 \le y \le 1$, and $0 \le x+y \le 1$). For example, the first conductive semiconductor layer 53 may include one selected from the group consisting of InAlGaN, GaN, AlGaN, AlInN, InGaN, AlN, and InN, and may be doped with N type dopants such as Si, Ge, and Sn.

Electrons (or holes) injected through the first conductive semiconductor layer 53 may be recombined with holes (or electrons) injected through the second conductive semiconductor layer 57 at the active layer 55, so that the active layer 55 emits the light based on the band gap difference of the energy band according to the intrinsic material of the active layer 55.

The active layer 55 may have one of a single quantum well structure, a multiple quantum well (MQW) structure, a quantum dot structure, and a quantum wire structure, but the embodiment is not limited thereto.

The active layer 55 may include a semiconductor material having a compositional formula of $In_xAl_yGa_{1-x-y}N$ ($0 \le x \le 1$, $0 \le y \le 1$, $0 \le x+y \le 1$). If the active layer 55 has a multiple quantum well structure, the active layer 55 may have a stack structure of well and barrier layers. For example, the active layer 55 may have a stack structure of InGaN well/GaN barrier layers.

A clad layer (not shown) doped with N or P type dopants may be formed on and/or under the active layer 55, and may include an AlGaN layer or an InAlGaN layer.

For example, the second conductive semiconductor layer 57 may include a P type semiconductor layer. The second conductive semiconductor layer 57 may include a semiconductor material having a compositional formula of $In_xAl_yGa_{1-x-y}N$ ($0 \le x \le 1$, $0 \le y \le 1$, and $0 \le x+y \le 1$). For example, the second conductive semiconductor layer 57 may include one selected from the group consisting of InAlGaN, GaN, AlGaN, InGaN, AlInN, AlN, and InN, and may be doped with P type dopants such as Mg, Zn, Ca, Sr or Ba.

An ohmic contact layer 58 may be formed on the second conductive semiconductor layer 57. The ohmic contact layer 58 may include a material making ohmic contact with respect to the second conductive semiconductor layer 57. For example, the ohmic contact layer 58 may have a single layer structure or a multiple layer structure including at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO.

Meanwhile, the first conductive semiconductor layer 53 may include a P type semiconductor layer, and the second conductive semiconductor layer 57 may include an N type semiconductor layer. In addition, a third conductive semiconductor layer (not shown) including an N type semiconductor layer or a P type semiconductor layer may be formed on the second conductive semiconductor layer 57. Accordingly, a light emitting structure layer may have at least one of NP, PN, NPN, and PNP junction structures. In addition, the doping concentration of impurities in the first and second conductive semiconductor layers 53 and 57 may be uniform or irregular. In other words, the light emitting structure layer may have various structures, but the embodiment is not limited thereto.

The first electrode layer 60 is provided on the first conductive semiconductor layer 53, and the second electrode layer 70 is provided above the second conductive semiconductor layer 57 to supply power to the active layer 55. The first and second electrode layers 60 and 70 may be electrically connected to the first and second electrodes 3 and 4 through the wire 7.

The light emitting device 5 has a wavelength band in the range of about 450 nm to about 480 nm, preferably, the central wavelength of about 465 nm, and has the FWHM (full width at half maximum) of about 15 nm to about 40 nm.

Figure 3:
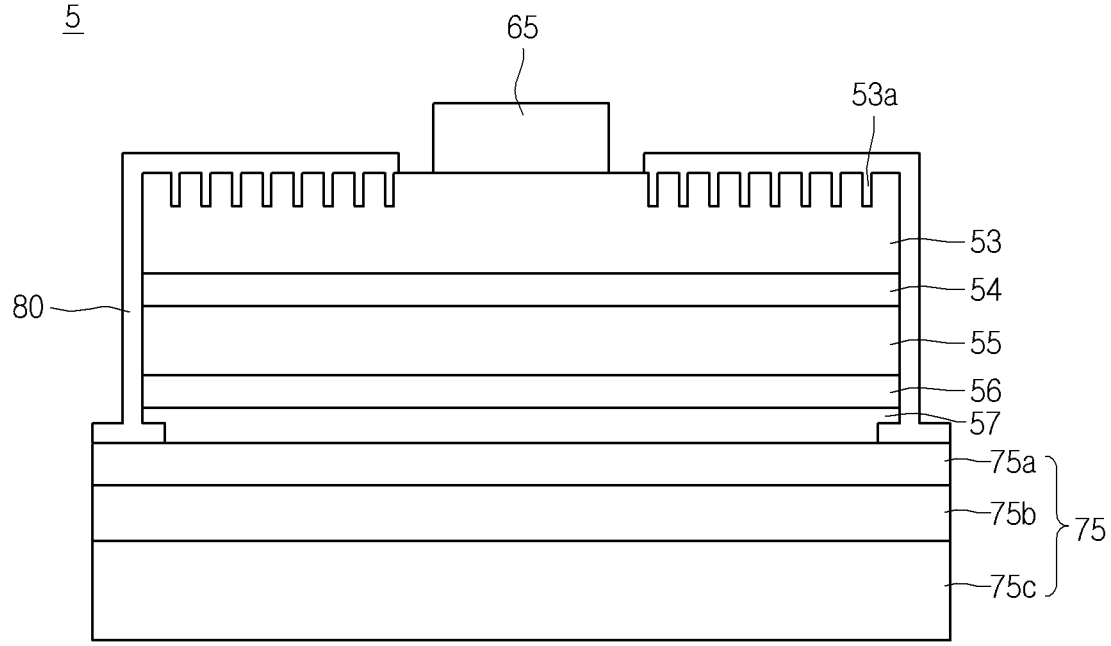
FIG. 3 is a sectional view showing a light emitting device in a light emitting apparatus according to the embodiment.

FIG. 3 is a sectional view showing the light emitting device 5 in a light emitting apparatus according to another embodiment. Hereinafter, the light emitting device of FIG. 3 will be described, and the structure and the components identical to those of the light emitting device of FIG. 2 will not be further described.

Referring to FIG. 3, the light emitting device 5 may include a conductive support substrate 75, the light emitting structure layer including the first conductive semiconductor layer 53, the active layer 55, and the second conductive semiconductor layer 57 on the conductive support substrate 75, and the electrode layer 65 formed on the first conductive semiconductor layer 53.

In addition, the first conductive InGaN/GaN superlattice structure or InGaN/InGaN superlattice structure 54 may be formed between the first conductive semiconductor layer 53 and the active layer 55.

The second conductive AlGaN layer 56 may be formed between the second conductive semiconductor layer 57 and the active layer 55.

A light extracting structure 53a having a column shape or a hole shape may be formed in the first conductive semiconductor layer 53, and allows light emitted from the active layer 55 to be effectively extracted to the outside. The light extracting structure 53a may have the form of a roughness on the top surface of the first conductive semiconductor layer 53 through a chemical treatment process such as a chemical etching.

The light extracting structure 53a may have one of a semispherical shape, a polygonal shape, a pyramid shape, and a nano-column shape. The light extracting structure 53a may include a photonic crystal.

The conductive support substrate 75 may support a light extracting structure layer, and may supply power to the light extraction layer together with the electrode layer 65.

The conductive support substrate 75 may include a support layer 75c, an ohmic contact layer 75a, and an adhesive layer 75b interposed between the support layer 75c and the ohmic contact layer 75a. The support layer 75c may include at least one selected from the group consisting of Cu, Ni, Mo, Al, Au, Nb, W, Ti, Cr, Ta, Pd, Pt, Si, Ge, GaAs, ZnO, and SiC. The ohmic contact layer 75a includes metal including Ag or Al, so that the ohmic contact layer 75a may make ohmic contact with respect to the second conductive semiconductor layer 57 and may serve as a reflective layer. In addition, the ohmic contact layer 75a may separately include an ohmic contact layer and a reflective layer. For example, the ohmic contact layer may include a material making ohmic-contact with respect to the second conductive semiconductor layer 57. For example, the ohmic contact layer may have a single layer structure or a multiple layer structure including at least one selected from the group consisting of ITO, IZO, IZTO, IAZO, IGZO, IGTO, AZO, ATO, GZO, IrO$_x$, RuO$_x$, RuO$_x$/ITO, Ni, Ag, Ni/IrO$_x$/Au, and Ni/IrO$_x$/Au/ITO.

The adhesive layer 75b may have a layer including at least one or two selected from the group consisting of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—P, Ni—Mn—Pd, Ni—P, and Pd—Ni.

The light extracting structure layer may include a compound semiconductor layer including a plurality of group III to V elements. A passivation layer 80 may be formed on a top surface and a lateral surface of the light extracting structure layer.

The first conductive semiconductor layer 53 may have an N type semiconductor layer. The first conductive semiconductor layer 53 may include a semiconductor material having a compositional formula of $In_xAl_yGa_{1-x-y}N$ ($0\leq x\leq 1$, $0\leq y\leq 1$, and $0\leq x+y\leq 1$). For example, the first conductive semiconductor layer 53 may include one selected from the group consisting of InAlGaN, GaN, AlGaN, AlInN, InGaN, AlN, and InN, and may be doped with N type dopants such as Si, Ge, and Sn.

Electrons (or holes) injected through the first conductive semiconductor layer 53 may be recombined with holes (or electrons) injected through the second conductive semiconductor layer 57 at the active layer 55, so that the active layer 55 emits the light based on the band gap difference of the energy band according to the intrinsic material of the active layer 55.

The active layer 55 may have one of a single quantum well structure, a multiple quantum well (MQW) structure, a quantum dot structure, and a quantum wire structure, but the embodiment is not limited thereto.

The active layer 55 may include semiconductor material having a compositional formula of $In_xAl_yGa_{1-x-y}N$ ($0\leq x\leq 1$, $0\leq y\leq 1$, $0\leq x+y\leq 1$). If the active layer 55 has a multiple quantum well structure, the active layer 55 may have a stack structure of well and barrier layers. For example, the active layer 55 may have a stack structure of InGaN well/GaN barrier layers.

A clad layer (not shown) doped with N or P type dopants may be formed on and/or under the active layer 55, and may include an AlGaN layer or an InAlGaN layer.

For example, the second conductive semiconductor layer 57 may include a P type semiconductor layer. The second conductive semiconductor layer 57 may include a semiconductor material having a compositional formula of $In_xAl_yGa_{1-x-y}N$ ($0\leq x\leq 1$, $0\leq y\leq 1$, and $0\leq x+y\leq 1$). For example, the second conductive semiconductor layer 57 may include one selected from the group consisting of InAlGaN, GaN, AlGaN, InGaN, AlInN, AN, and InN, and may be doped with P type dopants such as Mg, Zn, Ca, Sr or Ba.

Meanwhile, the first conductive semiconductor layer 53 may include a P type semiconductor layer, and the second conductive semiconductor layer 57 may include an N type semiconductor layer. In addition, a third conductive semiconductor layer (not shown) including an N type semiconductor layer or a P type semiconductor layer may be formed on the second conductive semiconductor layer 57. Accordingly, the light emitting structure layer may have at least one of NP, PN, NPN, and PNP junction structures. In addition, the doping concentration of impurities in the first and second conductive semiconductor layers 53 and 57 may be uniform or irregular.

In other words, the light emitting structure layer may have various structures, but the embodiment is not limited thereto.

A current blocking region (not shown) may be formed between the second conductive semiconductor layer 57 and the conductive support substrate 70 in such a manner that at least a part of the current blocking region overlaps with the electrode layer 60. The current blocking region may include a material having electrical conductivity lower than that of the conductive support substrate 70 or an electrical insulating material, or may be formed by applying plasma damage to the second conductive semiconductor layer 57. The current blocking region extensively spreads current to increase light efficiency of the active layer 55.

The electrode layer 65 may be electrically connected to the second electrode 4 through the wire 7, and the conductive support substrate 75 may be electrically connected to the first electrode 3 through the contact with the first electrode 3.

The light emitting device 5 has a wavelength band in the range of about 450 nm to about 480 nm, preferably, the central wavelength of about 465 nm, and has the FWHM (full width at half maximum) of about 15 nm to about 40 nm.

Figure 4:
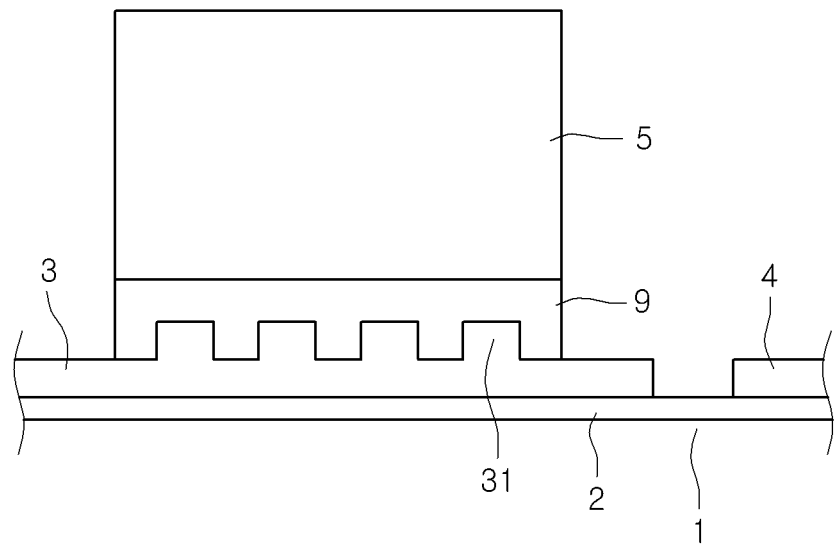
FIG. 4 is an enlarged view showing a bonding region of a light emitting device and a first electrode in a light emitting apparatus according to a first embodiment.

FIG. 4 is an enlarged view showing the bonding region of the light emitting device and the first electrode in the light emitting apparatus according to the first embodiment.

Referring to FIG. 4, in a light emitting apparatus 200 according to the first embodiment, a protrusion pattern 31 is formed on the top surface of the first electrode 3, and an adhesive layer 9 is formed on the top surface of the first electrode 3 including the protrusion pattern 31. The light emitting device 5 is provided on the adhesive layer 9. For example, the conductive support substrate 70 or the growth substrate 51 of the light emitting device 5 may make contact with the adhesive layer 9.

The protrusion pattern 31 is provided in a region of the light emitting device 5 in such a manner that the protrusion pattern 31 overlaps with the light emitting device 5 perpendicularly to the light emitting device 5. The protrusion pattern 31 may be formed at a predetermined pattern period on the top surface of the first electrode 3. According to another embodiment, the protrusion pattern 31 may be formed by selectively depositing metal on the top surface of the first electrode 3 through a mask pattern after forming a flat top surface of the first electrode 3. For example, the first electrode 3 may include a metallic layer including Au, and the protrusion pattern 31 may include a metallic layer including Au.

The adhesive layer 9 may have recesses corresponding to the protrusion pattern 31 of the first electrode 3 and closely adhere to the first electrode 3 without forming gaps between the adhesive layer 9 and the first electrode 3. For example, the adhesive layer 9 may include a metallic layer including Au—Sn.

In order to form the above adhesive structure, after forming the protrusion pattern 31 on the first electrode 3 and forming the adhesive layer 9 on the bottom surface of the light emitting device 5, the adhesive layer 9 is heated and melted. In this state, a force is imposed such that the adhesive layer 9 adheres to the first electrode 3.

In the light emitting apparatus 200 according to the first embodiment, the protrusion pattern 31 is formed on the first electrode 3, and surrounded by the adhesive layer 9, thereby increasing the contact area between the first electrode 3 and the adhesive layer 9. In other words, the top surface and the lateral surface of the protrusion pattern 31 are surrounded by the adhesive layer 9.

The thermal resistance between the first electrode 3 and the adhesive layer 9 is reduced, so that the thermal dissipation performance of the light emitting apparatus 200 can be improved.

Figure 9:
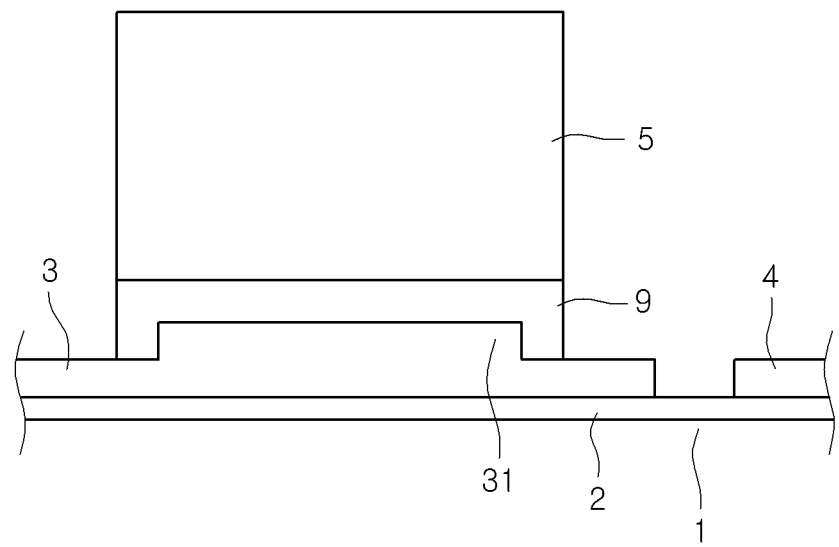
FIG. 9 is a sectional view showing a shape of a protrusion pattern in a light emitting apparatus according to another embodiment.

In a light emitting apparatus according to another embodiment shown in FIG. 9, only one protrusion pattern 31 may be formed. In this case, the protrusion pattern 31 may be more easily formed.

Figure 5:
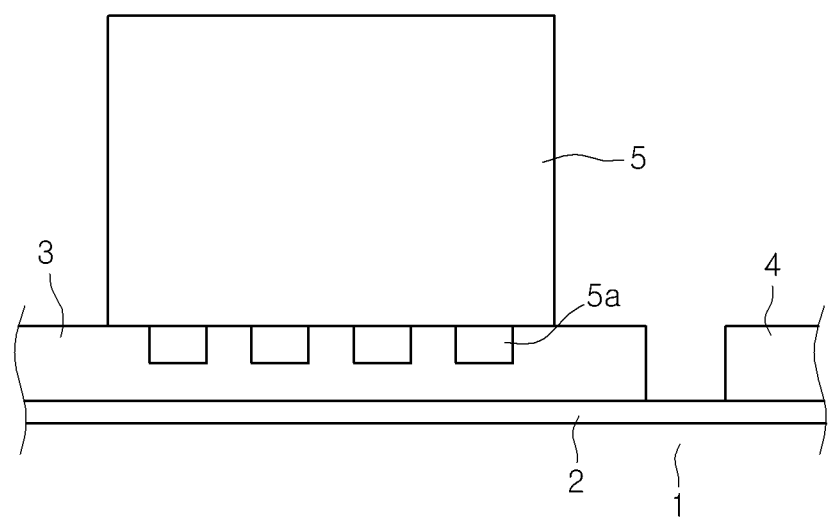
FIG. 5 is an enlarged view showing a bonding region of a light emitting device and a first electrode in a light emitting apparatus according to a second embodiment.

FIG. 5 is an enlarged view showing the bonding region of the light emitting device and the first electrode in the light emitting apparatus according to the second embodiment.

Referring to FIG. 5, in the light emitting apparatus 200 according to the second embodiment, a protrusion pattern 5a is formed on the bottom surface of the light emitting device 5, and the first electrode 3 is provided at a lower portion of the protrusion pattern 5a.

The protrusion patterns 5a may be formed at a predetermined period on the bottom surface of the light emitting device 5. For example, the protrusion patterns 5a may include a metallic layer including Au—Sn.

The first electrode 3 may have recesses corresponding to the protrusion patterns 5a. For example, the first electrode 3 may include a metallic layer including Au.

In order to form the above adhesive structure, after forming the protrusion pattern 5a on the bottom surface of the light emitting device 5, the first electrode 3 is heated and melted. In this state, a force is imposed such that the protrusion pattern 5a adheres to the first electrode 3. In this case, a portion of the first electrode 3 may directly make contact with the light emitting device 5.

In the light emitting apparatus 200 according to the second embodiment, the protrusion pattern 5a is formed under the light emitting device 5, and surrounded by the first electrode 3, so that the contact area between the protrusion pattern 5a and the first electrode 3 can be increased. In other words, the bottom surface and the lateral surface of the protrusion pattern 5a are surrounded by the first electrode 3.

Accordingly, the thermal resistance between the protrusion pattern 5a and the first electrode 3 is reduced, so that the thermal dissipation performance of the light emitting apparatus 200 can be improved.

Figure 10:
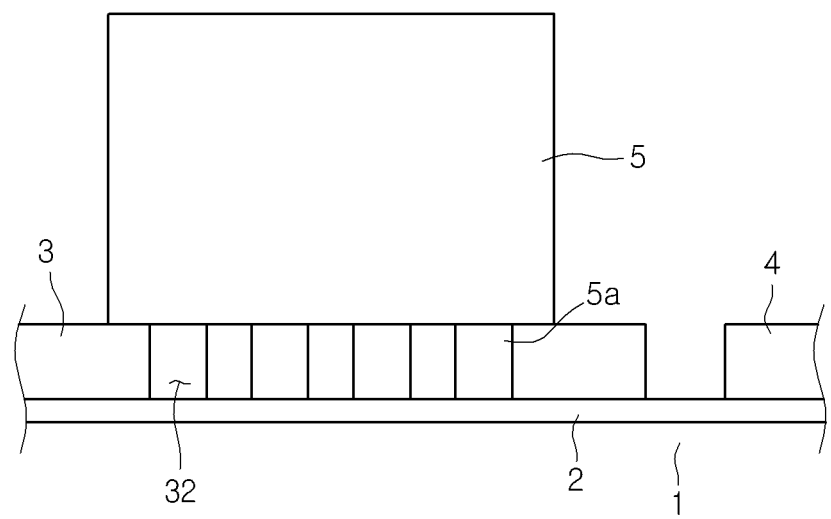

Meanwhile, in a light emitting apparatus according to another embodiment shown in FIGS. 10 and 11, a plurality of holes 32 may be formed in the first electrode 3 such that the insulating layer 2 is exposed, and a plurality of protrusion patterns 5a formed under the light emitting device 5 may be provided in the holes 32. In this case, the contact area of the protrusion patterns 5a and the first electrode 3 is more increased, so that heat may be more effectively transferred from the light emitting device 5 to the body 1. In addition, since the protrusion pattern 5a makes contact with the body 1 including the insulating layer 2, so that the heat may be more effectively transferred.

A plurality of light emitting apparatuses 200 according to the embodiment may be arrayed on a substrate, and an optical member including a light guide plate, a prism sheet, a diffusion sheet, and a luminescence sheet may be provided on the optical path of the light emitted from the light emitting apparatuses. The light emitting apparatuses, the substrate, and the optical member may serve as a backlight unit or a lighting unit. For instance, the lighting system may include a backlight unit, a lighting unit, an indicator, a lamp or a streetlamp.

Figure 6:
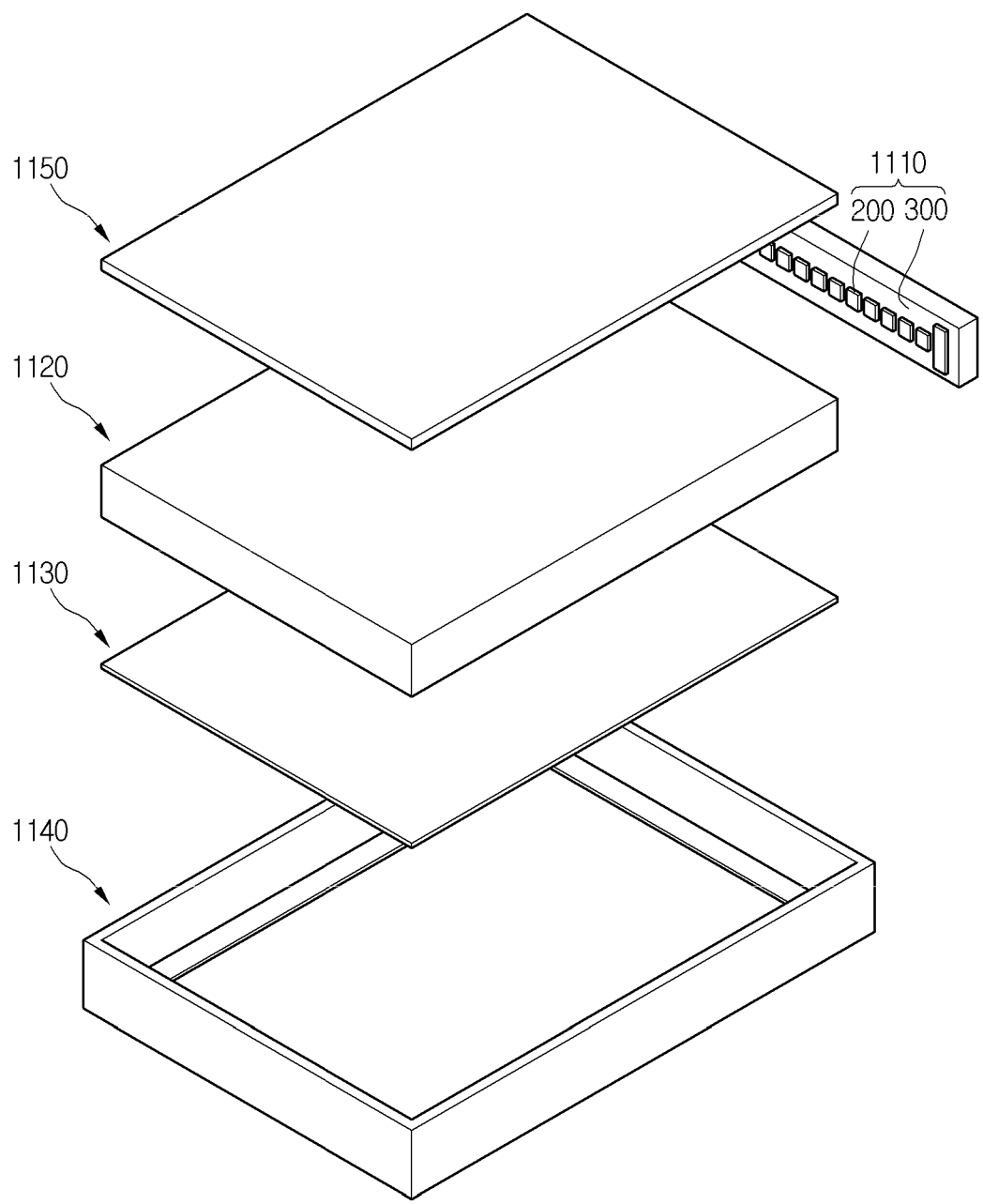
FIG. 6 is a view showing a backlight unit employing the light emitting apparatus according to the embodiments.

FIG. 6 is a view showing a backlight unit 1100 including the light emitting apparatus according to the embodiment. The backlight unit 1100 shown in FIG. 6 is an example of a lighting system, but the embodiment is not limited thereto.

Referring to FIG. 6, the backlight unit 1100 includes a bottom frame 1140, a light guide member 1120 installed in the bottom frame 1140, and a light emitting module 1110 installed at one side or on the bottom surface of the light guide member 1120. In addition, a reflective sheet 1130 is disposed under the light guide member 1120.

The bottom frame 1140 has a box shape having an open top surface to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate 300 and a plurality of light emitting apparatuses 200 according to the embodiments installed on the substrate 300. The light emitting apparatuses 200 can supply light to the light guide member 1120.

As shown in FIG. 6, the light emitting module 1110 is installed on at least one inner side of the bottom frame 1140 to provide the light to at least one side of the light guide member 1120.

In addition, the light emitting module 1110 can be provided under the bottom frame 1140 to provide the light toward the bottom surface of the light guide member 1120. Such an arrangement can be variously changed according to the design of the backlight unit 1100, but the embodiment is not limited thereto.

The light guide member 1120 is installed in the bottom frame 1140. The light guide member 1120 converts the light emitted from the light emitting module 1110 into the surface light to guide the surface light toward a display panel (not shown).

For example, the light guide member 1120 may include a light guide panel (LGP). For example, the light guide panel may be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the luminescence sheet. In this case, the diffusion sheet 1150 uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the luminescence sheet may include a transmissive plate or a transmissive film including phosphors.

The reflective sheet 1130 can be provided under the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 7:
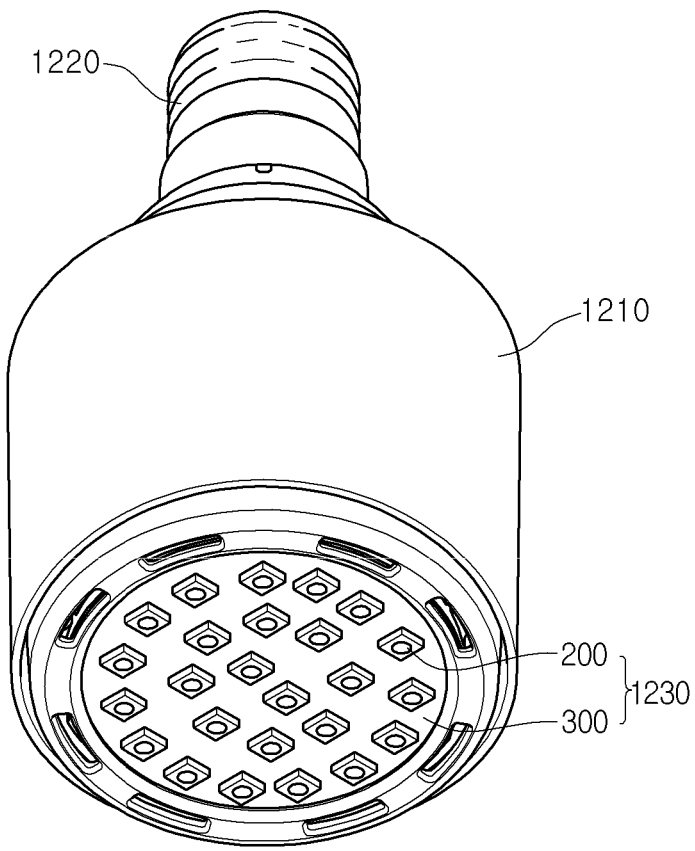
FIG. 7 is a perspective view showing a lighting unit employing the light emitting apparatus according to the embodiments.

FIG. 7 is a perspective view showing a lighting unit 1200 including the light emitting apparatus package according to the embodiments. The lighting unit 1200 shown in FIG. 7 is an example of a lighting system and the embodiment is not limited thereto.

Referring to FIG. 7, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 300 and at least one light emitting apparatus 200 according to the embodiment installed on the substrate 300.

The substrate 300 includes an insulating member printed with a circuit pattern. For example, the substrate 300 includes a PCB (printed circuit board), an MC (metal core) PCB, a flexible PCB, or a ceramic PCB.

In addition, the substrate 300 may include material that effectively reflects the light. The surface of the substrate 300 can be coated with a color, such as a white color or a silver color, to effectively reflect the light.

At least one light emitting apparatus 200 according to the embodiment can be installed on the substrate 300. Each light emitting apparatus 200 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a luminescence sheet can be provided in the path of the light emitted from the light emitting module 1230 to change the wavelength of the light emitted from the light emitting module 1230. For instance, if the light emitted from the light emitting module 1230 has a wavelength band of blue light, the luminescence sheet may include a yellow luminescence material. In this case, the light emitted from the light emitting module 1230 passes through the luminescence sheet so that the light is viewed as white light.

The connection terminal 1220 is electrically connected to the light emitting module 1230 to supply power to the light emitting module 1230. Referring to FIG. 7, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system according to the embodiments includes the lighting emitting apparatus according to the embodiments, so that thermal resistance can be reduced. Accordingly, light representing light efficiency can be discharged with reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
    a body;
    a first electrode having a protrusion pattern on the body;
    a second electrode physically separated from the first electrode on the body;
    an adhesive layer on the first electrode including the protrusion pattern; and
    a light emitting chip on the adhesive layer,
    wherein the light emitting chip comprises a substrate on the adhesive layer and a light emitting structure on the substrate,
    wherein the light emitting structure has a first conductive semiconductor layer, an active layer, and a second conductive semiconductor layer,
    wherein the adhesive layer is disposed between the light emitting chip and the first electrode, and the adhesive layer is directly contacted with a bottom surface of the light emitting chip,
    wherein the protrusion pattern is disposed under the light emitting chip,
    wherein the second electrode comprises an edge portion nearest to the first electrode,
    wherein a topmost surface of the protrusion pattern under the light emitting chip is higher than a topmost surface of the edge portion of the second electrode,
    wherein the adhesive layer includes a metal including Au-Sn, and the protrusion pattern includes a metal including Au,
    wherein at least one of the first conductive semiconductor layer and the second conductive semiconductor layer has a AlGaN layer,
    wherein the active layer has a semiconductor material having a compositional formula of $In_xAl_yGa_{1-x-y}N$ (where $0 \leq x \leq 1$, $0 \leq y \leq 1$, $0 \leq x+y \leq 1$), and
    wherein a distance from a bottom surface of the second electrode to a top surface of the protrusion pattern is greater than a thickness of the first electrode.

2. The light emitting apparatus as claimed in claim 1, wherein a top surface and a lateral surface of the protrusion pattern are surrounded by the adhesive layer.

3. The light emitting apparatus as claimed in claim 1, wherein the body includes silicon material, and the light emitting chip is mounted in a recess formed in a top surface of the body.

4. The light emitting apparatus as claimed in claim 1,
    wherein the light emitting chip comprises a conductive substrate on the adhesive layer, and a light emitting structure layer on the conductive substrate,
    wherein the light emitting structure layer comprises a first conductive semiconductor layer, an active layer, and a second conductive semiconductor layer, and
    wherein the first conductive semiconductor layer has a light extracting structure.

5. The light emitting apparatus as claimed in claim 4, wherein the adhesive layer is directly contacted with a bottom surface of the conductive substrate.

6. The light emitting apparatus as claimed in claim 1, further comprising an insulating layer between the body and the first and second electrodes, wherein the insulating layer includes a silicon oxide layer.

7. The light emitting apparatus as claimed in claim 1, wherein the first electrode closely adheres to the adhesive layer without forming a gap therebetween.

8. The light emitting apparatus as claimed in claim 1, further comprising an insulating layer on the body.

9. The light emitting apparatus as claimed in claim 1, wherein the protrusion pattern is provided only in a region where the emitting structure layer vertically overlaps with the protrusion pattern.

10. The light emitting apparatus as claimed in claim 1, wherein the protrusion pattern is formed at a predetermined pattern period on the first electrode.

11. The light emitting apparatus as claimed in claim 1, wherein the protrusion pattern comprises a plurality of protrusion patterns and all the plurality of protrusion patterns vertically overlap with the light emitting chip.

12. The light emitting apparatus as claimed in claim 1, wherein a maximum width of the protrusion pattern under the light emitting chip is greater than a total width of the light-emitting chip.

13. The light emitting apparatus as claimed in claim 1, wherein a top most surface of the protrusion pattern is flat.

14. The light emitting apparatus as claimed in claim 1, wherein the light emitting chip comprises a plurality of protrusion patterns on a substrate, a first conductive semiconductor layer, an active layer, a second conductive semiconductor layer, an ohmic contact layer on the second conductive semiconductor layer, and a first electrode layer on the first conductive semiconductor layer.

15. The light emitting apparatus as claimed in claim 1, wherein the protrusion pattern comprises a rectangle shape in a cross section.

16. The light emitting apparatus as claimed in claim 1, wherein the topmost surface of the protrusion pattern is disposed lower than a bottom surface of the light emitting chip.

17. A light emitting apparatus comprising:
    a body;
    a first electrode having a protrusion pattern on the body;
    a second electrode separated from the first electrode on the body;
    an adhesive layer on the first electrode including a pattern corresponded to the protrusion pattern of the first electrode; and
    a light emitting chip on the adhesive layer,
    wherein the light emitting chip comprises a substrate on the adhesive layer and a light emitting structure on the substrate,
    wherein the light emitting structure has a first conductive semiconductor layer, an active layer, and a second conductive semiconductor layer, wherein the adhesive layer is disposed between the substrate and the first electrode, the adhesive layer is directly contacted with a bottom surface of the substrate, and wherein a length from a bottom surface of the first electrode to a top surface of the protrusion pattern is greater than a thickness of the second electrode.

* * * * *